United States Patent
Eble, III et al.

(10) Patent No.: US 9,479,176 B1
(45) Date of Patent: Oct. 25, 2016

(54) METHODS AND CIRCUITS FOR PROTECTING INTEGRATED CIRCUITS FROM REVERSE ENGINEERING

(71) Applicant: Cryptography Research, Inc., San Francisco, CA (US)

(72) Inventors: John C. Eble, III, Chapel Hill, NC (US); Scott C. Best, Palo Alto, CA (US); Hanson Quan, Kensington, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/553,364

(22) Filed: Nov. 25, 2014

Related U.S. Application Data

(60) Provisional application No. 61/913,840, filed on Dec. 9, 2013.

(51) Int. Cl.
*H03K 19/177* (2006.01)

(52) U.S. Cl.
CPC .............................. *H03K 19/17768* (2013.01)

(58) Field of Classification Search
None
See application file for complete search history.

(56) References Cited

U.S. PATENT DOCUMENTS

| | | | |
|---|---|---|---|
| 5,783,846 A | 7/1998 | Baukus et al. | |
| 5,866,933 A | 2/1999 | Baukus et al. | |
| 5,930,663 A | 7/1999 | Baukus et al. | |
| 5,973,375 A * | 10/1999 | Baukus | H01L 21/743 257/399 |
| 6,064,110 A | 5/2000 | Baukus et al. | |
| 6,117,762 A | 9/2000 | Baukus et al. | |
| 6,373,111 B1 | 4/2002 | Zheng et al. | |
| 6,459,629 B1 | 10/2002 | Clark et al. | |
| 6,613,661 B1 | 9/2003 | Baukus et al. | |
| 6,740,942 B2 | 5/2004 | Baukus et al. | |
| 6,774,413 B2 | 8/2004 | Baukus et al. | |
| 6,791,191 B2 | 9/2004 | Chow et al. | |
| 6,815,816 B1 | 11/2004 | Clark et al. | |
| 6,893,916 B2 | 5/2005 | Baukus et al. | |
| 6,897,535 B2 | 5/2005 | Chow et al. | |
| 6,919,600 B2 | 7/2005 | Baukus et al. | |
| 6,924,552 B2 | 8/2005 | Baukus et al. | |
| 6,940,764 B2 | 9/2005 | Clark, Jr. et al. | |

(Continued)

FOREIGN PATENT DOCUMENTS

| | | |
|---|---|---|
| EP | 0295183 B1 | 10/1994 |
| GB | 2393851 B | 7/2005 |

(Continued)

OTHER PUBLICATIONS

Becker et al., "Stealthy Dopant-Level Hardware Trojans," Workshop on Cryptographic Hardware and Embedded Systems 2013, CHES 2013, pp. 197-214. 18 pages.

(Continued)

*Primary Examiner* — Crystal L Hammond
(74) *Attorney, Agent, or Firm* — Silicon Edge Law Group LLP; Arthur J. Behiel

(57) ABSTRACT

A camouflage circuit instantiated on a semiconductor substrate includes a transient-comparison circuit that briefly expresses a value representative of either a one or a zero in dependence upon reference elements that are visibly indistinct from a perspective normal to the planar surface substrate surface, but that nevertheless exhibit distinct electrical responses. Transient comparisons that define logic states only briefly vastly complicate the use of reverse-engineering tools and techniques that rely on optical stimulation to sense when transistors are on or off.

20 Claims, 5 Drawing Sheets

(56) References Cited

U.S. PATENT DOCUMENTS

| | | | |
|---|---|---|---|
| 6,979,606 B2 | 12/2005 | Chow et al. | |
| 7,008,873 B2 | 3/2006 | Chow et al. | |
| 7,049,667 B2 | 5/2006 | Chow et al. | |
| 7,166,515 B2 | 1/2007 | Clark et al. | |
| 7,217,977 B2 | 5/2007 | Chow et al. | |
| 7,242,063 B1 | 7/2007 | Chow et al. | |
| 7,294,935 B2 | 11/2007 | Chow et al. | |
| 7,344,932 B2 | 3/2008 | Chow et al. | |
| 7,501,836 B2* | 3/2009 | Hansen et al. | G01R 31/30 324/658 |
| 7,514,755 B2 | 4/2009 | Chow et al. | |
| 7,541,266 B2 | 6/2009 | Chow et al. | |
| 7,888,213 B2 | 2/2011 | Chow et al. | |
| 8,054,122 B2* | 11/2011 | Guo | H03K 17/145 327/333 |
| 8,111,089 B2 | 2/2012 | Cocchi et al. | |
| 8,151,235 B2 | 4/2012 | Chow et al. | |
| 8,332,722 B1* | 12/2012 | Vera Rojas | H03M 13/3776 714/752 |
| 8,350,308 B2 | 1/2013 | Humbert et al. | |
| 8,368,116 B2* | 2/2013 | Salcedo | H01L 27/0259 257/173 |
| 8,384,429 B2 | 2/2013 | Gammel et al. | |
| 2004/0061186 A1 | 4/2004 | Chow et al. | |
| 2004/0099912 A1 | 5/2004 | Chow et al. | |
| 2005/0161748 A1 | 7/2005 | Chow et al. | |
| 2005/0264300 A1* | 12/2005 | Chang | G01R 35/005 324/601 |
| 2006/0157803 A1 | 7/2006 | Chow et al. | |
| 2007/0224750 A1 | 9/2007 | Chow et al. | |
| 2007/0253240 A1* | 11/2007 | Manohar et al. | G11C 11/4125 365/154 |
| 2008/0159412 A1* | 7/2008 | Drost | H04L 25/0284 375/257 |
| 2008/0169833 A1* | 7/2008 | Anderson et al. | G06F 21/75 326/8 |
| 2010/0213974 A1 | 8/2010 | Chow et al. | |
| 2010/0301903 A1* | 12/2010 | Cocchi et al. | H03K 19/20 326/122 |
| 2011/0254589 A1* | 10/2011 | Gammel | G11C 13/0004 326/51 |
| 2012/0274350 A1* | 11/2012 | Reese | G06F 21/6209 326/8 |
| 2012/0313664 A1 | 12/2012 | Thacker, III et al. | |
| 2013/0300473 A1* | 11/2013 | Bass et al. | H03L 7/22 327/158 |
| 2014/0054696 A1* | 2/2014 | Lai | H01L 27/027 257/339 |
| 2015/0130506 A1* | 5/2015 | Bhunia | H01L 24/49 326/8 |

FOREIGN PATENT DOCUMENTS

| | | |
|---|---|---|
| GB | 2403593 B | 7/2005 |
| GB | 2391986 B | 10/2005 |
| GB | 2411293 B | 7/2006 |
| TW | 502384 | 9/2002 |
| TW | 550666 | 9/2003 |
| TW | 577138 B | 2/2004 |
| TW | I221318 | 9/2004 |
| TW | I250525 | 3/2006 |
| TW | I326485 | 6/2010 |
| TW | I327368 | 7/2010 |

OTHER PUBLICATIONS

Nedospasov et al., "Functional Integrated Circuit Analysis", 2012 IEEE International Symposium on Hardware-Oriented Security and Trust, Jun. 3-4, 2012. 6 pages.

Samyde et al, "On a New Way to Read Data from Memory", Proceedings of the First International IEEE Security in Storage Workshop 2003. 5 pages.

SMI, SypherMedia International, "Circuit Camouflage Technology", SMI IP Protection and Anti-Tamper Technologies, Version 1.9.8j, Mar. 2012. 6 pages.

* cited by examiner

METHODS AND CIRCUITS FOR PROTECTING INTEGRATED CIRCUITS FROM REVERSE ENGINEERING

FIELD OF THE INVENTION

The present invention relates generally to integrated circuits (ICs), and in particular to methods and circuits to make it more difficult to reverse engineer ICs.

BACKGROUND

Integrated circuits (ICs) are built up using a number of material layers. Materials selected for their electrical properties are deposited or grown on and within a semiconductor substrate. Using a process known as photolithography, each layer is patterned to add, remove or alter selected areas. A finished IC is therefore a substrate supporting a stack of patterned layers.

Modern ICs are complex and their development requires considerable effort and investment. Competitors can save considerable expense and move quickly to market by cloning extant ICs. Others may be interested in a gaining access to proprietary information that is stored or encoded in an IC.

Copyists have developed very sophisticated techniques for extracting proprietary designs and data. The patterned material layers are sequentially stripped and imaged. Software analyzes the resultant data to automatically recognize circuit features and their interconnectivity. Other inspection techniques can glean information about an IC by monitoring signals and field emissions of the IC in operation.

The process of extracting proprietary designs and data is commonly referred to as "reverse engineering." Those interested in protecting their designs and data desire robust means of obstructing the reverse engineer.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
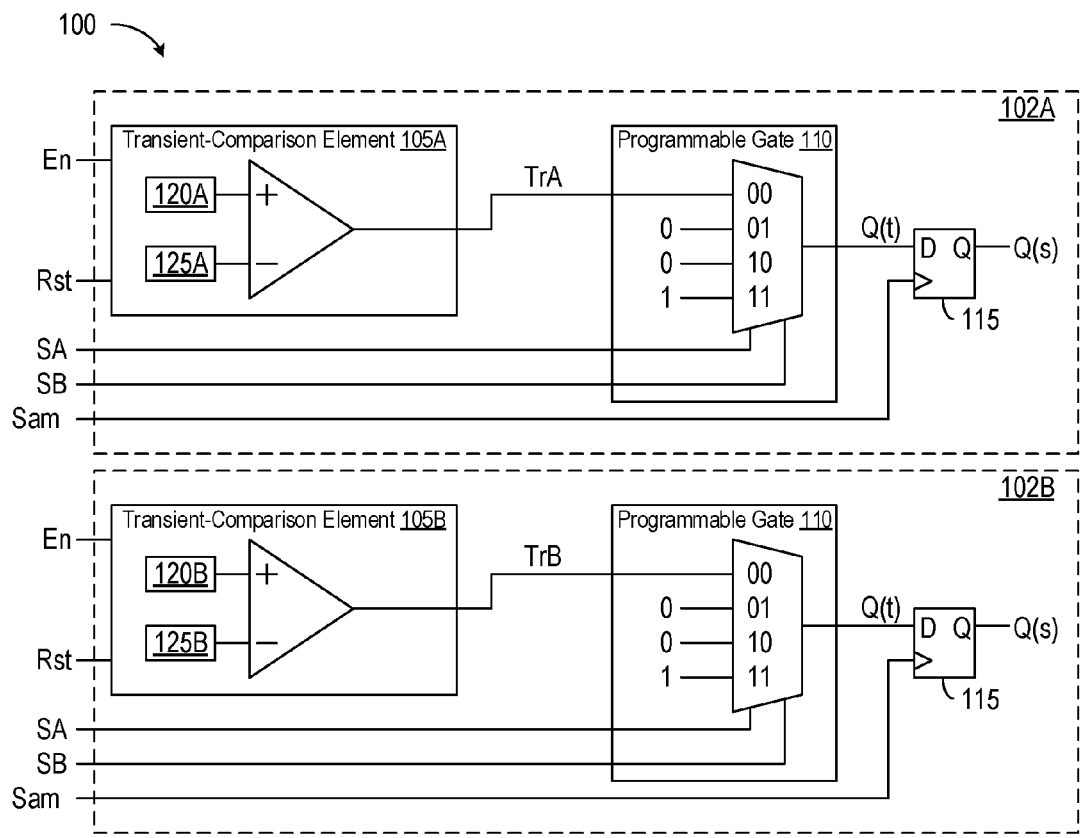
FIG. 1 depicts a camouflage circuit 100 that can be instantiated on a semiconductor substrate to obscure proprietary logic or data, and thus frustrate attempts at reverse engineering.

FIG. 1 depicts a camouflage circuit 100 that can be instantiated on a semiconductor substrate to obscure proprietary logic or data, and thus frustrate attempts at reverse engineering. Circuit 100 is divided into two apparently identical camouflage circuits 102A and 102B that, despite their apparent identity, are functionally distinct. In this context, "apparent identity" means that both camouflage circuits 102A and 102B are visibly indistinct from a perspective normal to the planar surface substrate surface, even absent any overlying material layers.

Camouflage circuit 102A includes a transient-comparison circuit 105A, a programmable gate 110, and a sequential storage element 115. Comparison element 105A provides a transient programming signal TrA that expresses a value representative of either a one or a zero in dependence upon reference elements 120A and 125A that are visibly indistinct from a perspective normal to the planar surface substrate surface, even absent any overlying material layers. Reference element 120A and 125A might be e.g. capacitors or transistors that look identical from the normal perspective but behave differently due to manufactured differences in their constituent material layers. Camouflage circuit 102B is similar to circuit 102A, but includes a transient-comparison circuit 105B with reference elements 120B and 125B that are visibly indistinct but functionally different from elements 120A and 125A. The remaining like-identified elements of circuits 102A and 102B are identical in this example.

With reference to circuit 102A, a pair of compare-activation signals, an enable signal En and a reset signal Rst, controls the timing of the comparison between elements 120A and 125A so that signal TrA only appears briefly. Gate 110 can thus be counted on to provide its required logic function only during periodic or aperiodic time windows established by transient signal TrA. Storage element 115, shown in this embodiment as an edge triggered flip-flop, is intended to be representative of a digital circuit which utilizes the camouflaged combinational logic function of gate 110. In this embodiment, the representative circuit simply captures signal QA(t) as signal QA(s) on the rising edge of a sample signal Sam. Many other utilizations of the camouflaged combinational logic function of gate 110 are of course possible.

Limiting the logical operation of gate 110 to brief windows of time (e.g., defined by signals En and Rst) can frustrate attempts at reverse engineering. For example, knowing whether transistors are on or off gives important clues about a circuit's function. Transistors under certain optical stimulation ionize differently depending on whether they are on or off. Some reverse-engineering tools can image the emissions of an operational circuit to capture those differences in ionization to discern transistor states. Capturing such images takes time, however. Transient comparisons that define logic states only briefly can frustrate the use of such tools.

Figure 2:
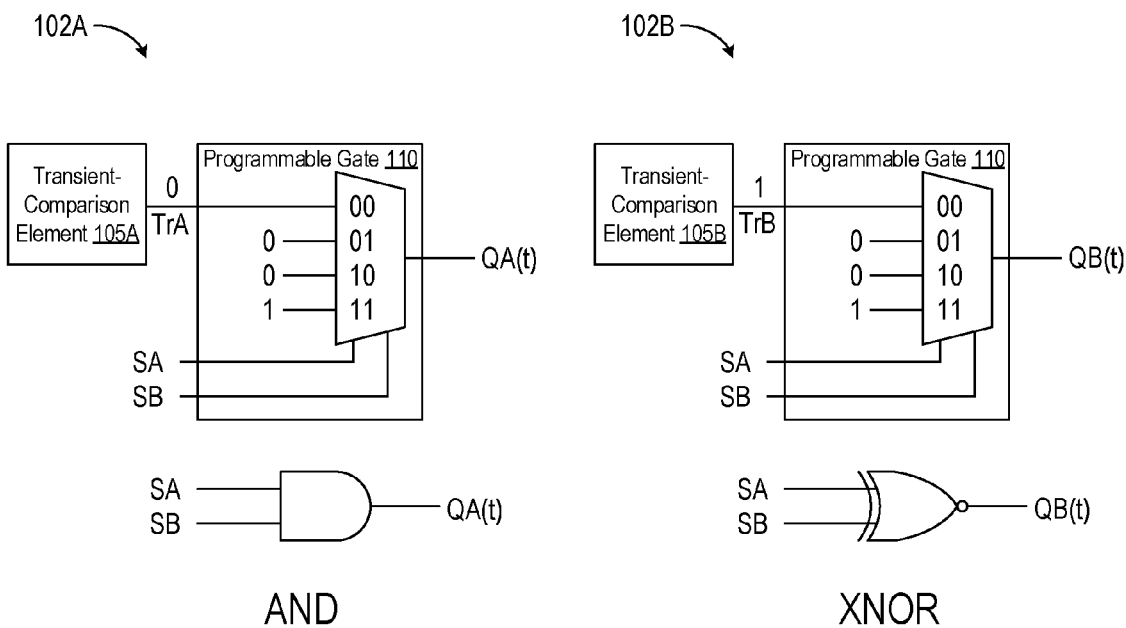
FIG. 2 depicts camouflage circuits 102A and 102B of FIG. 1.

FIG. 2 depicts camouflage circuits 102A and 102B of FIG. 1 with some features omitted for ease of illustration.

Each programmable gate 110 includes a four-input multiplexer in which input node 00 is coupled to the output of a respective comparison circuit 105A/105B to receive the transient signal TrA/TrB; nodes 01 and 10 are connected to logic zeros (e.g., ground potential); and node 11 is connected to a logic one (e.g., VDD). Only one input to each programmable gate 110—node 00—is obscured in this example, but the input signals to one or more of the other nodes can likewise be camouflaged.

Referring first to camouflage circuit 102A at left, comparison element 105A is seen to produce a logic-zero output signal (Signal TrA=0). With this and the other three inputs, gate 110 performs a logical AND function (i.e., output QA(t) is only a one if signals SA and SB are both one). Referring next to camouflage circuit 102B at right, signal TrB is set to a logic one. Gate 110 thus performs a logical XNOR function (i.e., output QB(t) is only a one if signals SA and SB are the same). Camouflage circuits 102A and 102B can thus provide different logical functions despite being visibly indistinct from a perspective normal to the IC that contains them. Input signals SA and SB are the same for both circuits 102A and 102B, but can be overlapping or entirely different signals.

FIGS. 1 and 2 depict only two visibly indistinct camouflage circuits, but practical embodiments may have many more. The circuits can respond to the same or different signals during the same or different time periods, and the resulting logical combinations can be further combined using simple or complex recursive and dynamic logic functions (e.g., signal QA(s) can be fed back as an input to one or both circuits 102A and 102B). The resulting transitory signals and functions provided by visibly indistinct circuitry greatly complicates reverse engineering.

Figure 3:
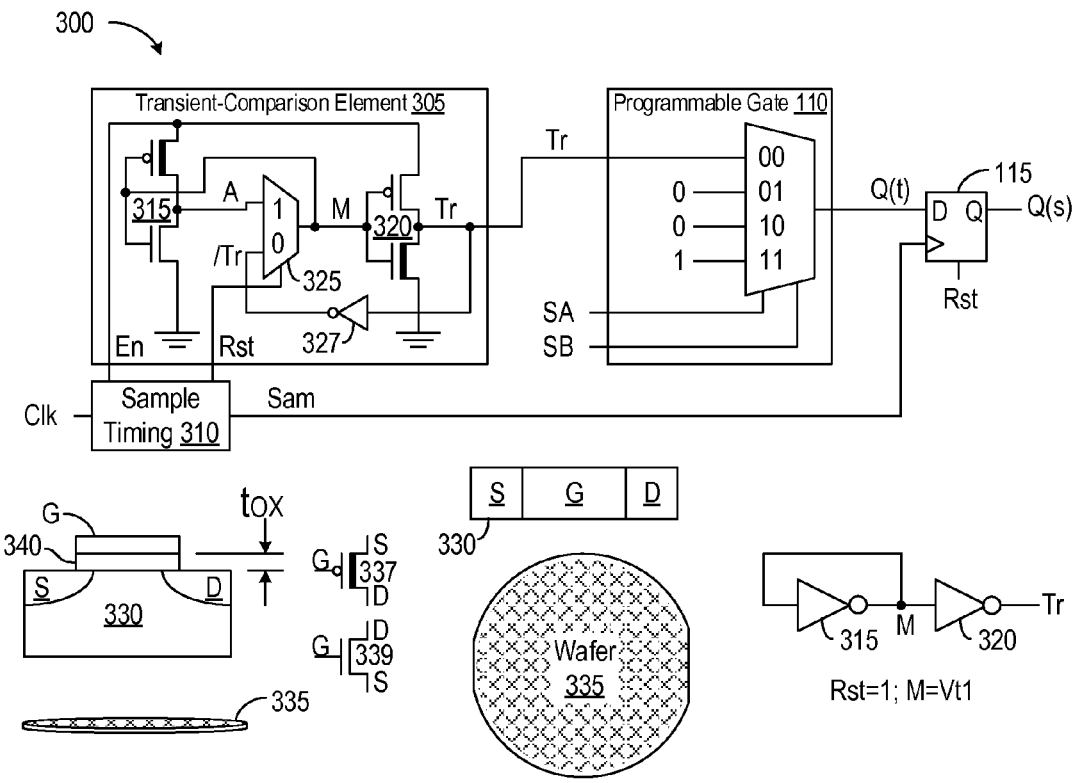
FIG. 3 depicts a camouflage circuit 300 in accordance with another embodiment.

FIG. 3 depicts a camouflage circuit 300 in accordance with another embodiment. Circuit 300 includes a comparison circuit 305 in which transistors with different gate dielectrics serve as reference elements. A sample-timing circuit 310 creates the time window during which transitory signal Tr is valid and asserts sample signal Sam during the time window. A clock signal Clk serves as a timing reference for signals En, Rst, and Sam. Programmable gate 110 functions as noted in connection with FIG. 2, so a detailed treatment is omitted here.

Comparison element 305 includes a pair of unbalanced CMOS inverters 315 and 320 with an analog, or "pass-gate," multiplexer 325 disposed between them. The PMOS transistor of inverter 315 has a gate dielectric that is thick relative to that of the corresponding NMOS device, the relative thickness illustrated using a relatively bold line for the channel region of the PMOS transistor. The roles of the PMOS and NMOS transistors of inverter 320 are reversed, with the NMOS transistor having the thicker dielectric. A CMOS inverter 327 with balanced PMOS and NMOS transistors (not shown) provides feedback between the output of inverter 320 and input In0 of multiplexer 325.

Those of skill in the art are familiar with basic transistor functionality. A brief summary of the impact of dielectric thickness on transistor performance may nevertheless aid in understanding comparison element 305 in this embodiment. The lower left of FIG. 3 shows a cut-away view of a simple MOS transistor 330. Hundreds of millions of these simple devices can be formed on and within a semiconductor wafer 335, which is shown here in side view below the cut-away view to illustrate the perspective for transistor 330.

Transistor 330 has a gate G, a source S, and a drain D. Gate G is conductive, and is electrically isolated from the source and drain by an insulating dielectric layer 340, the "gate dielectric." (Schematic representations of a PMOS transistor 337 and an NMOS transistor 339 illustrate source gate G, source S, and drain D connectivity.) Transistor 330 passes current between source S and drain D when a voltage applied between gate G and source S reaches a threshold voltage Vth that is a function of the thickness $t_G$ of gate dielectric 340. Other attributes being equal, transistors having different dielectric thicknesses will have different threshold voltages.

Transistors with different gate-dielectric thicknesses can look identical from a perspective normal to the planar surface substrate surface. Such a perspective is illustrated at the lower middle of FIG. 3, in which transistor 330 appears in plan view (i.e., as viewed from the top) adjacent wafer 335 viewed from the normal perspective. Gate dielectrics are exceedingly thin, typically on the order of nanometers. Dielectric thickness can be observed in cross section using powerful microscopes. However, such observation requires manual, destructive, and error-prone cross-sectional analysis. It is therefore difficult and expensive to measure the gate-dielectric thickness of a given transistor, and much more so to measure the thicknesses of many transistors distributed over a substrate surface.

Returning to comparison element 305, the transistors with relatively thick and thin dielectrics serve as electrically distinct reference elements that are visibly indistinct from a perspective normal to the substrate surface. The rest of comparison element 305 serves as comparison circuitry that compares the electrically distinct properties of the transistors in inverters 315 and 320, timed to enable and reset signals En and Rst, to produce the transient programming signal Tr that dictates the logical function provided by gate 110. As described earlier, this logical function is available—and therefore detectable—only for a brief window of time (e.g., defined by the En and Rst control signals).

Figure 4:
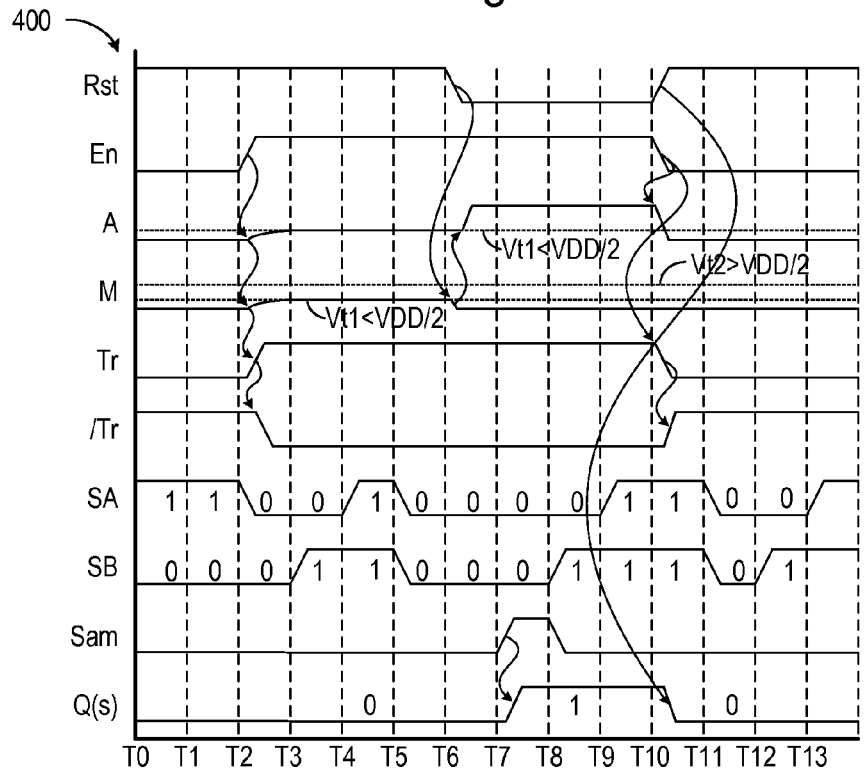
FIG. 4 is a waveform diagram 400 illustrating the operation of camouflage circuit 300 of FIG. 3 in accordance with one embodiment.

FIG. 4 is a waveform diagram 400 illustrating the operation of camouflage circuit 300 of FIG. 3 in accordance with one embodiment. Circuit 300 is to perform a logical XNOR on input signals SA and SB during a brief, deterministic period and present the result as signal Q(s). Input signals SA and SB are shown to transition occasionally between logic levels, this to emphasize that output Q(s) is only a function of signals SA and SB during the period established by comparison element 305. Camouflage circuits in accordance with some embodiments include multiple, or even a great many, instantiations of circuit 300 responding to the same signals during different time periods, and those signals can also be functions of those or other instantiations of circuit 300. Complex recursive and dynamic logic functions can thus be performed in a manner that is very difficult to reverse engineer.

Before timing circuit 310 asserts signal En, inverters 315 and 320 lack power and their output nodes are essentially at ground potential. Multiplexer 325 and inverter 327 are powered via connections that are not shown but are well understood by those of skill in the art, so inverter 327 drives nodes/Tr and M high. Asserting reset signal Rst connects the output from inverter 315 to both its own input and the input of inverter 320, though prior to enable signal En being asserted these nodes are low as described above.

Asserting enable signal En delivers supply voltage VDD to each inverter 315 and 320. With reset signal Rst asserted, multiplexer 325 shorts the input and output nodes of inverter 315, which causes both nodes A and M to settle at a threshold voltage of inverter 315. This connectivity is illustrated at the lower right in FIG. 3. Not to be confused with the threshold voltages of the constituent transistors, an inverter's threshold voltage is the voltage on its input above which its output will be lower and below which its output will be higher. The threshold voltage of an inverter is a function of the threshold voltages of its two transistors. If the transistors of inverter 315 were balanced, the inverter threshold voltage would be about VDD/2, or half way between supply voltages ground and VDD. The transistors of inverter 315 are not balanced, however; rather, the NMOS transistor has the thinner oxide, and thus the lower threshold voltage. The threshold voltage Vt1 of inverter 315 is therefore reduced below VDD/2. As shown in FIG. 4, the shorted nodes A and M settle at the relatively low threshold voltage Vt1.

Unlike inverter 315, it is the PMOS transistor that is relatively strong in inverter 320. The threshold voltage Vt2 of inverter 320 is therefore relatively high, generally above the threshold voltage VDD/2 of a balanced inverter, and well above threshold voltage Vt1 of inverter 315. The combination of a strong-N transistor in inverter 315 combined with a strong-P transistor in inverter 320 therefore results in the output signal Tr being high, to a value representative of a logic one. Inverter 327 inverts this output signal, driving node/Tr to ground. When reset signal Rst is deasserted at time T6, the low voltage from inverter 327 is applied to the input of inverter 320, clamping output signal Tr high for as long as enable signal En is asserted. Note that if alternatively inverter 315 employed a strong-P transistor while inverter 320 employed a strong-N transistor, the output signal Tr would remain low. Since the relative strength of transistors of the same geometry cannot be readily determined from visual inspection only, this approach described above achieves the intended operation of a visibly indistinguishable camouflaged logic element. Note also that there are other techniques, well known to those skilled in the art, of increasing or decreasing the strength of a transistor relative to nominal. The embodiment described above uses gate oxide thickness as the mechanism, but other techniques (e.g., doping density options intended to specifically adjust a transistor's threshold voltage) may also be employed.

In this example the transient comparison of signals SA and SB is taken when sample signal Sam is asserted at time T7, and is held until reset signal is asserted at time T10. When the sample is taken at time T7, signal Tr is at a level representative of a logic one and both signals SA and SB express voltages representative of logic zeros. The logic one to terminal 00 of gate 110 programs gate 110 to perform the XNOR function of input signals SA and SB, so the logic-zero values for signals SA and SB yield a logic-one value for signal Q(s). In this example, storage element 115 holds the sample value until reset signal RST is re-asserted.

Timing circuit 310 returns enable signal En to zero, which saves power when circuit 300 is not in use and complicates some emission-based reverse-engineering techniques as described earlier. In embodiments, circuit 300 can perform consecutive logic functions without deasserting the enable signal. Signal Q(s) can be made to transition between logic levels while outside of the relevant timing window to further confuse circuit operation.

Figure 5:
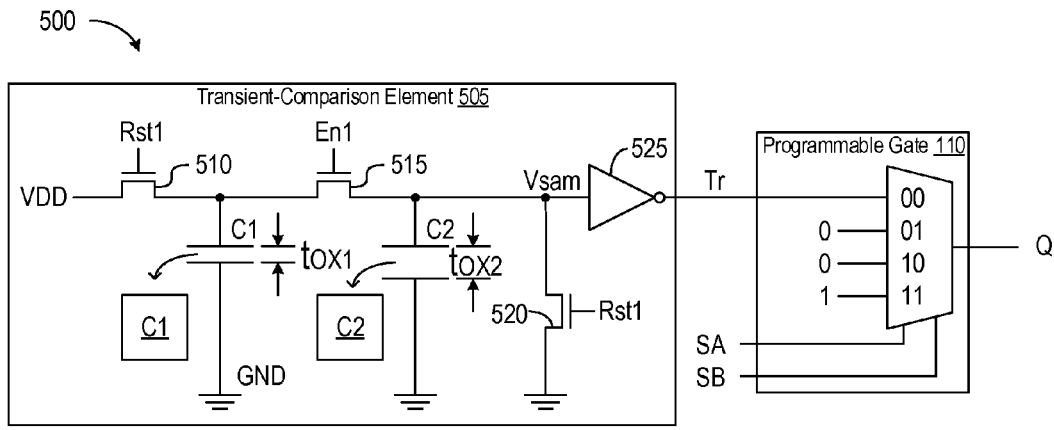
FIG. 5 depicts a camouflage circuit 500 in accordance with an embodiment that employs capacitors C1 and C2 as reference elements in a transient-comparison element 505 that dictates the logic function of a programmable gate 110.

FIG. 5 depicts a camouflage circuit 500 in accordance with an embodiment that employs capacitors C1 and C2 as reference elements in a transient-comparison element 505 that dictates the logic function of a programmable gate 110. Gate 110 is as detailed above in connection with FIGS. 1 and 2, though other suitable logic is well known to those of skill in the art.

Comparison element 505 includes three transistors 510, 515, and 520 that control the flow of charge to and from capacitors C1 and C2 responsive to a reset signal Rst1 and an enable signal En1. Note that the transistors here could be replaced with other analog-switch elements, but simple NFET transistors are the simplest approach and should suffice. This circuitry produces a transient voltage signal Vsam that is a function of the relative values of capacitors C1 and C2, and is thus indicative of a comparison between their respective capacitances. An inverter 525 drives programming signal Tr either low or high in dependence upon this comparison.

Each of capacitors C1 and C2 includes two conductive plates that are parallel with one another and with a substrate surface, and stores a quantity of charge when a voltage is applied across its plates. To a first approximation, the quantity of stored charge for such a capacitor is proportional to its area, from a perspective normal to the substrate, and inversely proportional to the distance separating its plates. This thickness is commonly referred to as $t_{OX}$, the thickness of an oxide material used as an insulator between the plates.

In one embodiment, capacitors C1 and C2 are built to have substantially the same width and length (and thus substantially the same area), and are thus visibly indistinct from a perspective normal to the substrate surface. In a first mode, the dielectric thickness $t_{OX1}$ of capacitor C1 is selected to be substantially thinner than the dielectric thickness $t_{OX2}$ of capacitor C2, however, so capacitor C1 has substantially higher capacitance than capacitor C2 (in a typical semiconductor process, a thin-oxide capacitor's oxide is one-third to one-fourth the thickness of the thick-oxide capacitor). Circuit 500 senses this difference to produce a transient programming signal Tr that dictates the logic function of gate 110 for a brief time window.

Inverter 525 is constructed to have a threshold voltage approximately midway between supply voltages ground GND and VDD. When reset signal Rst1 is asserted, capacitor C1 is charged to voltage VDD and capacitor C2 is discharged to ground GND. Voltage Vsam is at a level representative of a logic zero, and programming signal Tr from inverter 525 is driven high, to a level representative of a logic one.

The program state of comparison element 505 is read by deasserting signal Rst1 and asserting enable signal En. Deasserting signal Rst1 disconnects capacitor C1 from supply voltage VDD and isolates node Vsam from ground. Asserting enable signal En1 connects capacitors C1 and C2 in parallel so that charge from capacitor C1 flows to capacitor C2 until the voltage across both is equal. If the storage capacity of capacitor C1 is greater than that of capacitor C2, as is the case in this example, then the voltage across the two capacitors—and presented as signal Vsam on the input of inverter 525—will rise above the threshold of inverter 525. The output of inverter 525 will thus transition low, presenting a logic zero to input 00 of gate 110. As explained in connection with FIG. 2, a logic zero to gate 110 produces an AND function. If the storage capacity of capacitor C1 is less than that of capacitor C2 (e.g., if in a second mode capacitor C1 were selected to be built with a thick-ox option while capacitor C2 was built with the thin-ox option), then the voltage presented as signal Vsam on the input of inverter 525 will remain below the threshold of inverter 525. The output of inverter 525 will thus remain high and gate 110 produces an XNOR function.

IC-fabrication processes routinely provision for different dielectric thicknesses. Capacitance is also a function of dielectric material, and different dielectrics can be used in other embodiments to create electrical differences that are not readily apparent.

Figure 6:
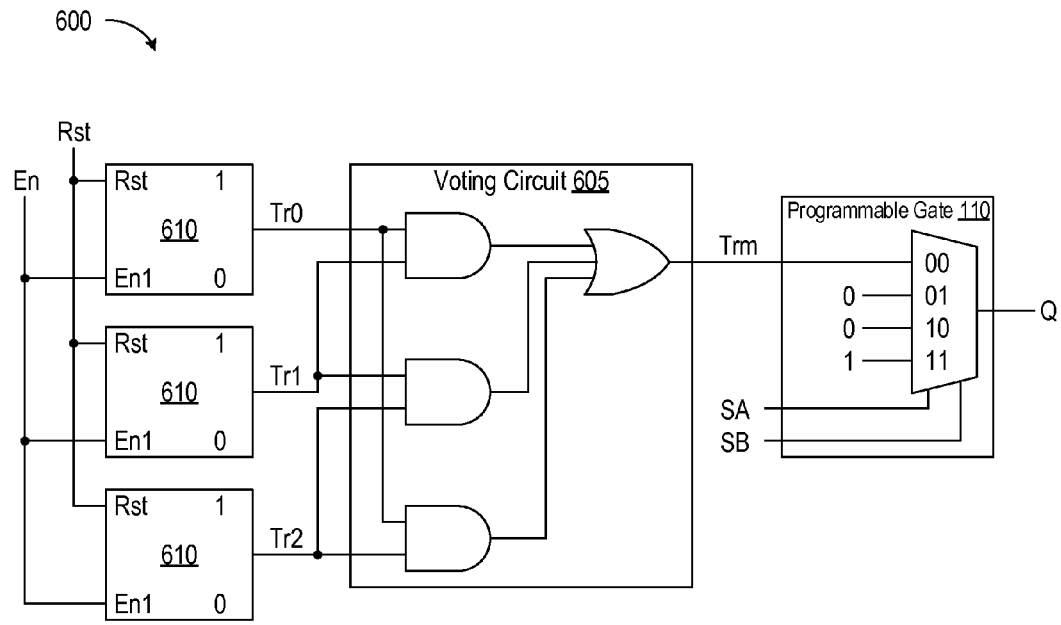
FIG. 6 depicts a camouflage circuit 600 in accordance with another embodiment.

FIG. 6 depicts a camouflage circuit 600 in accordance with another embodiment. Variations within otherwise acceptable IC-fabrication tolerances may make it difficult for camouflage circuits to produce error-free comparisons. The thicknesses of dielectric layers and the relative strength of otherwise identical transistors can vary by 20 to 50%, for example, potentially producing comparison errors between transistors, capacitors, or both. Circuit 600 ameliorates such problems using a voting circuit 605 that produces a majority output signal Trm based on a majority vote between three transient-comparison elements 610, which may be like those detailed in connection with the foregoing figures.

Figure 7A:
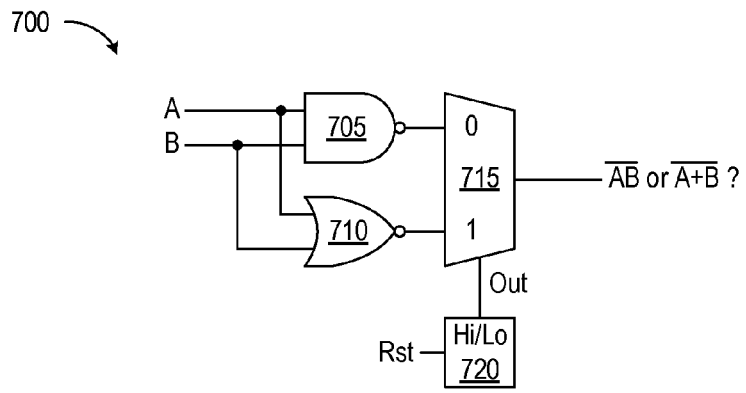
FIG. 7A depicts a camouflage circuit 700 in accordance with another embodiment.

FIG. 7A depicts a camouflage circuit 700 in accordance with another embodiment. A pair of logic signals A and B are input to both an AND gate 705 and an OR gate 710. A multiplexer 715 selects the output from one of gates 705 and 710 based on the output Out from a transient-comparison circuit 720. When a reset signal Rst is deasserted (a relatively low voltage), output signal Out is either a logic one or a logic zero based on obscured circuit features. An observer recognizing the functions of the gates and multiplexer would not know whether the logical operation of circuit 700 was the NAND function $\overline{AB}$ or the NOR function $\overline{A+B}$.

Figure 7B:
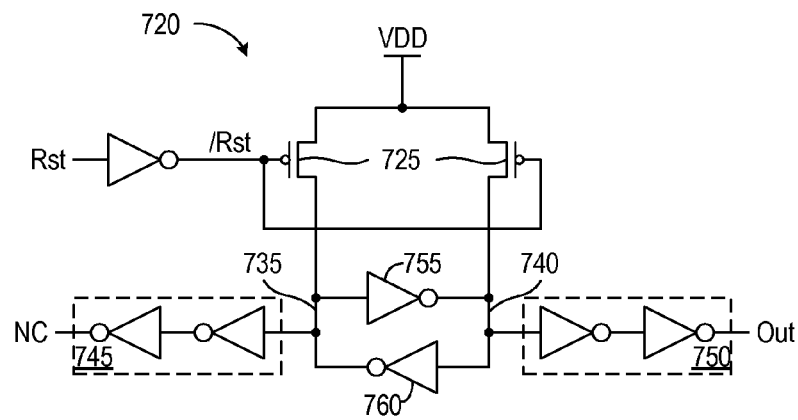
FIG. 7B illustrates an embodiment of transient-comparison circuit 720 of FIG. 7A.

While the approaches detailed above could be used to realize circuit 720, FIG. 7B illustrates an embodiment of transient-comparison circuit 720 of FIG. 7A. As with the previous approaches, circuit 720 is a type of read-only, non-volatile memory cell that can be made and programmed using standard IC processes.

In FIG. 7B, two PMOS transistors 725 connect interior nodes 735 and 740 to supply node VDD when a reset signal/Rst is asserted (low). These levels overwhelm inverters 755 and 760 so that both nodes NC (for "not connected") and Out convey logic levels representative of a logic one. When reset signal/Rst is deasserted (high), interior nodes 735 and 740 are disconnected from supply node VDD, allowing a pair of inverters 755 and 760 to determine whether output Out is driven low or high. As in the example of FIG. 3, each of inverters 755 and 760 includes a PMOS transistor and an NMOS transistor. For circuit 720 to output a logic zero (low) level when active, in inverter 755 the PMOS transistor is strong relative to nominal (e.g., it has a relatively low threshold voltage compared to nominal) while the NMOS transistor is weak relative to nominal (e.g., it has a relatively high threshold voltage), with the opposite being the case for inverter 760. The threshold voltages can be chosen by using thin-oxide and thick-oxide transistors as shown in FIG. 3 or different threshold voltage implant layers can be used that are visibly indistinct both from a perspective normal to the IC and a cross-section viewpoint. For circuit 720 to output a logic one (high) level when active, the roles of inverters 755 and 760 are reversed. Inverter pairs 745 and 750 capacitively balance nodes 735 and 740 so that the load—e.g. other cells and routing in a sea of gates—does not influence the stored state.

Reset signal Rst can be distributed to many instantiations of circuit 720. With reset signal Rst asserted, these circuits 720 will output a collection of values—in this case all ones—that do not reflect the requisite combination of program states for the associated logic to be functional. The reset state thus renders the camouflaged circuitry inoperable. In other embodiments, the reset signal can be used to drive different transient-comparison circuits to different states. In either case, maintaining circuit 720 in a reset state when the camouflaged logic is not needed can be an effective deterrent to reverse-engineering techniques that employ clock pausing and voltage contrasting. The ability to produce transient comparisons is also greatly advantageous for obscuring asynchronous designs.

Circuit 720 is just one example of a storage cell that amplifies small differences due to devices with skewed threshold voltages. Other variants of this type of cell including a ring structure with an even number of gates (possibly greater than two). Other embodiments that store information based on skewed threshold voltages or capacitances will be evident to those of skill in the art.

Figure 8:
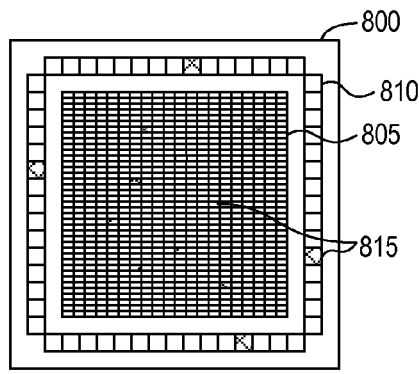
FIG. 8 depicts an IC 800 in accordance with an embodiment in which obscured functions are distributed throughout a sea of gates 805 to frustrate attempts at reverse engineering.

FIG. 8 depicts an IC 800 in accordance with an embodiment in which obscured functions are distributed throughout a sea of gates 805 to frustrate attempts at reverse engineering. IC 800 includes input/output cells 810 to facilitate communication between core logic provided by gate 805 and external circuitry (not shown). As highlighted with shading, obscured-logic circuits 815 can be distributed across IC 800 to make them difficult to find and to make cross-sectional analysis prohibitively expensive. Further, different obscured-logic circuits 815 can employ different properties or different combinations of properties to obscure their functions. Some might rely on disparate transistors, while others might rely on disparate capacitors, for example. Still other embodiments may additionally include more conventional camouflage circuits to further increase the difficulty of reverse-engineering.

This illustration of FIG. 8 is a gross oversimplification: modern ICs can have many millions of gates. Imaging systems and software can greatly facilitate the location of circuit elements, but cross-sectional analysis is largely mechanical and time consuming, particularly when the devices of interest are not collinear, and thus require multiple cross-sections.

Figure 9:
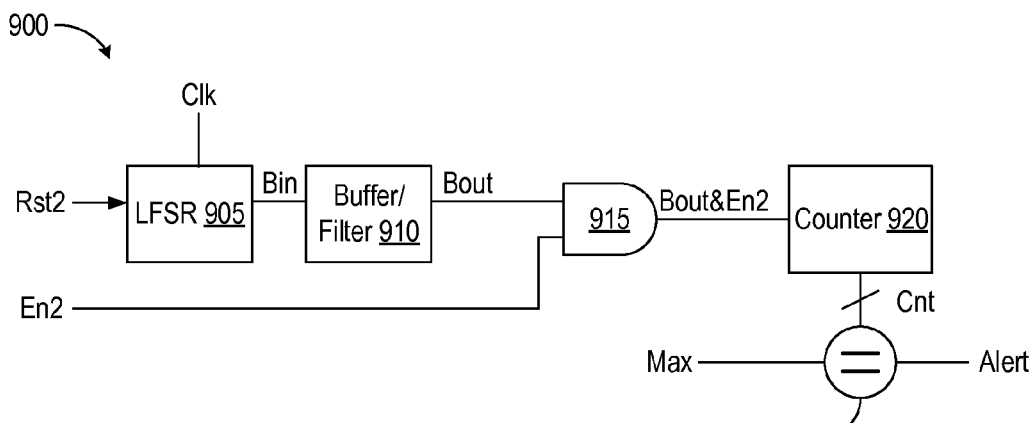
FIG. 9 depicts a camouflage circuit 900 that can be instantiated on an IC substrate to hinder attempts at reverse engineering.

FIG. 9 depicts a camouflage circuit 900 that can be instantiated on an IC substrate to hinder attempts at reverse engineering. Camouflage circuit 900 is made of what appear to be conventional and well-understood circuit elements: a linear-feedback shift register (LFSR) 905, a buffer 910, an AND gate 915, a counter 920, and some form of comparison logic 925. Each of these elements is recognizable by close inspection of an IC die by a motivated copyist. Once recognized, their collective function is apparent. In this camouflaged example, however, one or more of the elements of circuit 900 exhibits an obscured function so that the actual function of circuit 900 differs from its apparent function. The obscured function is due, in this embodiment, to imbalances in reference elements that result from physical properties difficult or impossible to discern by optical inspection techniques available to the reverse engineer. Circuit 900 is made up of standard circuit features that would not stand out in a field of other standard cells.

LFSR 905 conventionally produces a pseudo-random sequence of bits when clocked repeatedly. The output of LFSR 905 is deterministic in the sense that it step through a predictable sequence of states. Consequently, an LFSR that starts with a known value will experience a predictable number of signal transitions after a given number of clock periods. Asserting a reset signal Rst2 returns LFSR 905 to a known value. Signal generators other than LFSRs can be used to create input signal Bin in other embodiments.

The apparent function of buffer 910 is to simply amplify the output of LFSR 905—buffer input Bin—and present the resultant camouflage signal Bout to AND gate 915. When enable signal En2 is asserted, AND gate 915 passes the camouflage signal to counter 920, which counts the number of high pulses that occur while signal En2 is asserted. Comparison logic 925 compares the counted number of pulses with a maximum number Max and issues an alert signal Alert should the count reach that maximum number. The number Max can be derived empirically in simulation by setting signal Bout equal to signal Bin (e.g., removing buffer 910) and counting the number of high pulses reaching counter 920 while enable signal En2 is asserted.

The actual operation of buffer 910 does not reflect its apparent operation. Rather, buffer 910 includes electrically distinct reference elements that are visibly indistinct from a perspective normal to the substrate. The electrical distinctions limit performance such that buffer 910 cannot perform low-to-high transitions fast enough to communicate the shortest high pulses of signal Bin. Buffer 910 performs a high-to-low transition in a manner equivalent to its apparent operation, that is, this transition is no different from any other gate transition expected in the device. As a consequence, signal Bout&En2 will exhibit fewer high pulses than would be expected of LFSR 905, and count Cnt from counter 920 will not reach maximum value Max. Were circuit 900 copied, however, signal Bout would be expected to reflect all the transitions of signal Bin. In that case count Cnt would meet or exceed value Max, and comparison logic would assert signal Alert. Assertion of alert signal Alert could provide some form of evasive action, such as to disable other circuit elements or interfere with some required security procedure.

Figure 10:
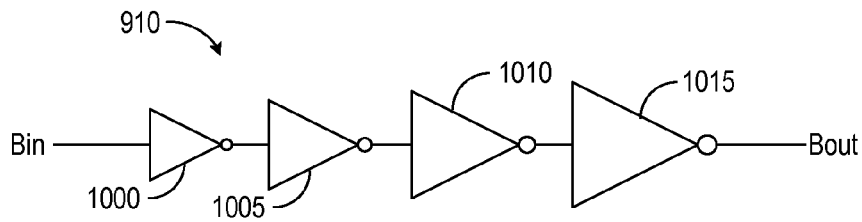
FIG. 10 depicts an embodiment of buffer 910 of FIG. 9.

FIG. 10 depicts an embodiment of buffer 910 of FIG. 9. Buffer 910 includes a chain of four CMOS inverters 1000, 1005, 1010, and 1015. Inverters 1000 and 1010 are "weak-N" inverters, which is to say that the NMOS transistor is a weak conductor relative to the PMOS transistor. Such relative weakness can be established using e.g. a thicker gate dielectric, lighter source and drain doping, or both. Inverters 1005 and 1015 are "weak-P" inverters, which is to say that the PMOS transistor is a weak conductor relative to the NMOS transistor. Alternately weakening transition edges of the inverters in this way reduces the sensitivity of buffer 910 so that it cannot accurately reproduce short-lived high pulses at signal Bin. Buffer 910 is thus effectively a low-pass filter circuit that, in combination with other elements, acts as a transient-comparison circuit to produce decisions responsive to the actual operation of the switching elements in filter 910 rather than the apparent operation.

Figure 11:
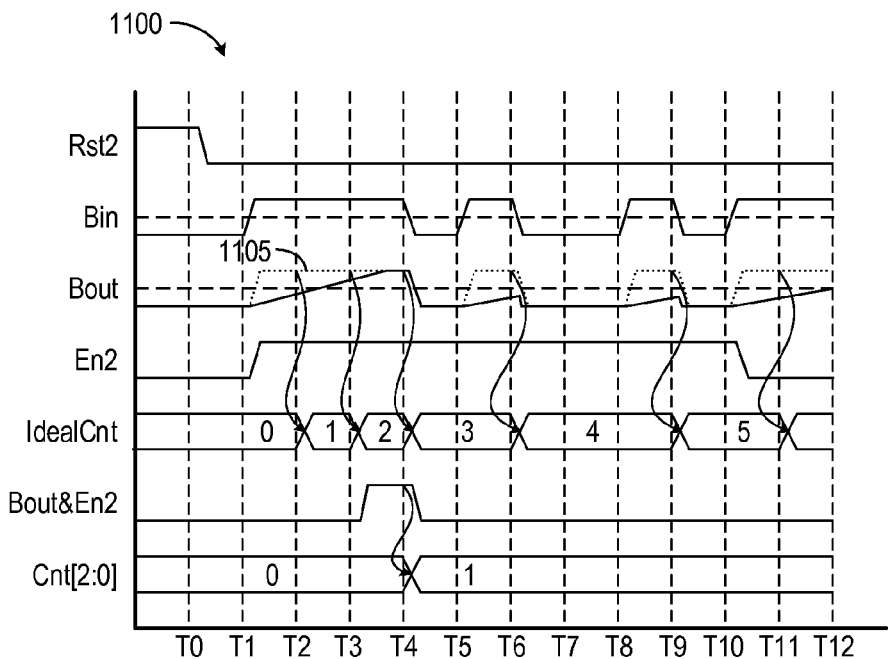
FIG. 11 is a waveform diagram 1100 illustrating the operation of camouflage circuit 900 in accordance with one embodiment.

FIG. 11 is a waveform diagram 1100 illustrating the operation of camouflage circuit 900 of FIG. 9 in accordance with one embodiment. Once reset signal Rst2 is de-asserted, LFSR 905 begins to transition between logic levels, producing signal Bin. Were buffer 910 capable of reproducing high pulses of all durations, signal Bin would be replicated at node Bout, as illustrated by a dashed waveform 1105. Buffer 910 is performance limited, however, and so produces a waveform that represents fewer high pulses than what would be expected based on an analysis of circuit 900. In this example, ideal waveform 1105 represents a logic one during five of the sample times highlighted using dashed lines, namely T2, T3, T4, T6, and T9. By comparison, the distorted waveform on node Bout represents a logic one just once, at time T4. In the example of FIG. 9, if value Max were set above one, then alert signal Alert would not be asserted. A pirated copy of circuit 900, lacking the performance-limiting obscured features of buffer 910, would count all single Bin high pulses to accumulate a count meeting reference count Max during the enable period, and thus produce an Alert.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. A signal driving circuit is said to "output" a signal to a signal receiving circuit when the signal driving circuit asserts (or de-asserts, if explicitly stated or indicated by context) the signal on a signal line coupled between the signal driving and signal receiving circuits.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A camouflage circuit instantiated on a planar surface of a substrate, the camouflage circuit comprising:
   a programmable logic gate to produce an output signal that is a logic function of input signals, wherein the logic function is dictated by a transient programming signal; and
   a comparison element coupled to the programmable logic gate to provide the transient programming signal, the comparison element including:
      reference elements that are visibly indistinct from a perspective normal to the planar surface of the substrate, absent overlying material layers; and
      comparison circuitry to produce the transient programming signal responsive to a compare-activation signal and a comparison between the reference elements.

2. The camouflage circuit of claim 1, further comprising a sequential storage element coupled to the programmable logic gate to sample the output signal during a timing window determined by the transient programming signal.

3. The camouflage circuit of claim 1, wherein the programmable logic gate and comparison element define one obscured-logic circuit among many obscured-logic circuits distributed across the substrate.

4. The camouflage circuit of claim 3, further comprising a voting circuit coupled to at least three of the obscured-logic circuits to produce a majority output signal responsive to a majority of the output signals from the at least three obscured-logic circuits.

5. The camouflage circuit of claim 3, wherein the obscured-logic circuits are identical from the perspective normal to the planar surface.

6. The camouflage circuit of claim 1, wherein the reference elements include a first reference element exhibiting a first capacitance and a second reference element exhibiting a second capacitance different from the first capacitance.

7. The camouflage circuit of claim 6, wherein the first and second reference elements comprise capacitors having different dielectric thicknesses.

8. The camouflage circuit of claim 6, wherein the first and second reference elements comprise transistors having different gate dielectrics.

9. The camouflage circuit of claim 1, wherein the compare-activation signal is transient.

10. The camouflage circuit of claim 1, further comprising a sample-timing circuit coupled to the comparison element to produce the compare-activation signal in synchronization with a clock signal.

11. A method for instantiating an integrated circuit, exhibiting an obscured function, on a planar surface of a substrate, the method comprising:
   instantiating electrically distinct reference elements on the substrate, wherein the reference elements are visibly indistinct from a perspective normal to the planar surface of the substrate, absent any overlying material layers;
   instantiating switching elements on the substrate, the switching elements having an apparent operation, when viewed from the perspective, and an actual operation that is a function of the reference elements; and
   instantiating a transient-comparison circuit on the substrate, the transient-comparison circuit to produce decisions responsive to the actual operation of the switching elements.

12. The method of claim 11, wherein the transient-comparison circuit comprises a programmable gate.

13. The method of claim 11, further comprising a signal generator to generate a transitioning input signal, wherein the switching elements count transitions of the input signal.

14. The method of claim 11, wherein the reference elements comprise transistors exhibiting different threshold voltages.

15. The method of claim 11, wherein the reference elements comprise capacitors having different capacitances.

16. A camouflage circuit instantiated on a substrate, the circuit comprising:
   a signal generator to generate a transitioning signal; and
   a buffer coupled to the signal generator, the buffer including electrically distinct reference elements that are visibly indistinct from a perspective normal to a surface of the substrate, absent any overlying material layers, the buffer to output a camouflage signal responsive to the transitioning signal.

17. The camouflage circuit of claim 16, further comprising a counter coupled to the buffer to count responsive to the camouflage signal.

18. The camouflage circuit of claim 17, further comprising transient-comparison circuitry coupled to the counter to decide whether the counter crosses a threshold over a time period.

19. The camouflage circuit of claim 16, wherein the signal generator comprises a linear-feedback shift register.

20. The camouflage circuit of claim 16, wherein the transitioning signal transitions pseudo-randomly.

* * * * *

UNITED STATES PATENT AND TRADEMARK OFFICE
CERTIFICATE OF CORRECTION

Page 1 of 1

PATENT NO. : 9,479,176 B1
APPLICATION NO. : 14/553364
DATED : October 25, 2016
INVENTOR(S) : John C. Eble, III, Scott C. Best and Hanson Quan It is certified that error appears in the above-identified patent and that said Letters Patent is hereby corrected as shown below:

On the Title Page

(73) Assignee: "Rambus Inc., Sunnyvale, CA (US)" should be changed to --Cryptography Research, Inc., San Francisco, CA (US)--

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*